US011237224B2

(12) United States Patent
Noh

(10) Patent No.: US 11,237,224 B2
(45) Date of Patent: Feb. 1, 2022

(54) MAGNETIC PROPERTY MEASURING SYSTEMS, METHODS OF MEASURING MAGNETIC PROPERTY, AND METHODS OF FABRICATING MAGNETIC MEMORY DEVICES USING THE SAME

(71) Applicant: Samsung Electronics Co., Ltd., Suwon-si (KR)

(72) Inventor: Eunsun Noh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 53 days.

(21) Appl. No.: 16/592,086

(22) Filed: Oct. 3, 2019

(65) Prior Publication Data
US 2021/0103011 A1 Apr. 8, 2021

(51) Int. Cl.
| | |
|---|---|
| *H01L 27/22* | (2006.01) |
| *G01R 33/032* | (2006.01) |
| *H01L 43/02* | (2006.01) |
| *H01L 43/12* | (2006.01) |
| *H01L 21/66* | (2006.01) |
| *G01R 15/24* | (2006.01) |
| *G01R 33/12* | (2006.01) |

(52) U.S. Cl.
CPC ....... *G01R 33/0325* (2013.01); *G01R 15/243* (2013.01); *G01R 33/032* (2013.01); *H01L 22/14* (2013.01); *H01L 27/22* (2013.01); *H01L 43/02* (2013.01); *H01L 43/12* (2013.01); *G01R 33/12* (2013.01)

(58) Field of Classification Search
CPC ..... H01L 22/14; H01L 43/12; H01L 21/6838; H01L 27/228; H01L 43/02; H01L 27/22; H01F 41/34; H01F 10/3254; H01F 10/3286; G01R 33/0325; G01R 33/1207; G01R 15/243; G01R 33/032; G01R 33/14
See application file for complete search history.

(56) References Cited

U.S. PATENT DOCUMENTS

| | | | |
|---|---|---|---|
| 5,075,546 A | 12/1991 | Kamada et al. | |
| 5,621,717 A * | 4/1997 | Finkelstein | .......... G11B 7/0037 |
| | | | 369/112.16 |
| 5,736,856 A | 4/1998 | Oliver et al. | |
| 5,822,063 A * | 10/1998 | Suzuki | ................... G01N 21/21 |
| | | | 356/364 |
| 6,504,355 B2 | 1/2003 | Minier | |
| 2002/0109904 A1 * | 8/2002 | MacDonald | ....... G02B 26/0825 |
| | | | 359/291 |
| 2019/0295616 A1 * | 9/2019 | Noh | ..................... G11C 11/1673 |
| 2021/0025951 A1 * | 1/2021 | Vajda | ................. G01R 33/1207 |

FOREIGN PATENT DOCUMENTS

| | | |
|---|---|---|
| JP | H06174810 A | 6/1994 |
| JP | 3739190 B2 | 1/2006 |

* cited by examiner

*Primary Examiner* — Jarrett J Stark
(74) *Attorney, Agent, or Firm* — Harness, Dickey & Pierce, P.L.C.

(57) ABSTRACT

A magnetic property measuring system may include a stage configured to load a sample and to rotate the sample about a rotation axis such that the stage rotates the sample by a rotation angle, the rotation axis extending normal to a top surface of the sample. The magnetic property measuring system may further include a polarizer having a first polarization axis, and an analyzer having a second polarization axis. The polarizer and the analyzer may enable the first and second polarization axes to be independently rotated based on the rotation angle of the sample.

9 Claims, 15 Drawing Sheets

MAGNETIC PROPERTY MEASURING SYSTEMS, METHODS OF MEASURING MAGNETIC PROPERTY, AND METHODS OF FABRICATING MAGNETIC MEMORY DEVICES USING THE SAME

BACKGROUND

The present disclosure relates to magnetic property measuring systems, magnetic property measuring methods, and methods of fabricating magnetic memory devices using the same, and in particular, to system for and methods of measuring magnetic properties of magnetic tunnel junctions using a magneto-optical Kerr effect (MOKE) and methods of fabricating magnetic memory devices using the same.

With increasing demand for electronic devices with increased speed and/or reduced power consumption, there is a requirement for semiconductor memory devices with faster operating speeds and/or lower operating voltages. Magnetic memory devices have been suggested to satisfy such requirements. A magnetic memory device may include a magnetic tunnel junction (MTJ) pattern. A magnetic tunnel junction pattern may include two magnetic elements and an insulating layer interposed therebetween. A resistance value of the magnetic tunnel junction pattern may be determined based on magnetization directions of the two magnetic elements. For example, when the two magnetic elements have antiparallel magnetization directions, the magnetic tunnel junction pattern may have a high resistance value, and when the two magnetic elements have parallel magnetization directions, the magnetic tunnel junction pattern may have a low resistance value. The difference in resistance value may be used to write or read data to or from the magnetic tunnel junction pattern.

In the case where the two magnetic elements each have a magnetization direction perpendicular to an interface between the insulating layer and the magnetic element, the magnetic tunnel junction pattern may be referred to as a perpendicular-type magnetic tunnel junction pattern. A polar magneto-optical Kerr effect (MOKE) measuring system may be used to measure a perpendicular magnetic property of the perpendicular-type magnetic tunnel junction pattern.

SUMMARY

Some example embodiments of the inventive concepts provide a magnetic measurement system capable of providing an improved signal-to-noise ratio property.

Some example embodiments of the inventive concepts provide a method of easily measuring a magnetic property of a magnetic tunnel junction pattern.

Some example embodiments of the inventive concepts provide a method of fabricating a magnetic memory device, which is suitable for a mass-production and has stable quality characteristics.

According to some example embodiments of the inventive concepts, a magnetic property measuring system may include a stage configured to load a sample and to rotate the sample about a rotation axis such that the stage rotates the sample by a rotation angle, the rotation axis extending normal to a top surface of the sample. The magnetic property measuring system may include a polarizer having a first polarization axis, and an analyzer having a second polarization axis. The polarizer and the analyzer may be configured to enable the first and second polarization axes to be independently rotated based on the rotation angle of the sample.

According to some example embodiments of the inventive concepts, a magnetic property measuring method may include preparing a sample including a substrate and a plurality of magnetic tunnel junction patterns horizontally spaced apart from each other on the substrate, measuring a magnetic property of the magnetic tunnel junction patterns at a first position on the sample, rotating the sample about a rotation axis normal to a top surface of the sample to move a measurement position from the first position to a second position on the sample, rotating the first polarization axis and the second polarization axis based on a rotation angle of the sample, and measuring a magnetic property of the magnetic tunnel junction patterns at the second position. The measuring of the magnetic property at the first position may include irradiating an incident light beam onto the first position and detecting polarization of a reflection light beam reflected from the first position based on the irradiating. The incident light beam irradiated onto the first position through a polarizer may have a first polarization axis, and the reflection light beam may pass through an analyzer having a second polarization axis.

According to some example embodiments of the inventive concepts, a method of fabricating a magnetic memory device may include forming a magnetic tunnel junction layer on a substrate, patterning the magnetic tunnel junction layer to form magnetic tunnel junction patterns, measuring a magnetic property of the magnetic tunnel junction patterns, and determining whether the measured magnetic property is within an allowable range. The measuring of the magnetic property of the magnetic tunnel junction patterns may include measuring the magnetic property of the magnetic tunnel junction patterns at a first position on a top surface of the substrate, rotating the substrate about a rotation axis normal to the top surface of the substrate to move a measurement position from the first position to a second position on the top surface of the substrate, rotating the first polarization axis and the second polarization axis based on a rotation angle of the substrate, and measuring a magnetic property of the magnetic tunnel junction patterns at the second position. The measuring of the magnetic property at the first position may include irradiating an incident light beam onto the first position and detecting polarization of a reflection light beam reflected from the first position based on the irradiating. The incident light beam may be irradiated onto the first position through a polarizer having a first polarization axis, and the reflection light beam may pass through an analyzer having a second polarization axis.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
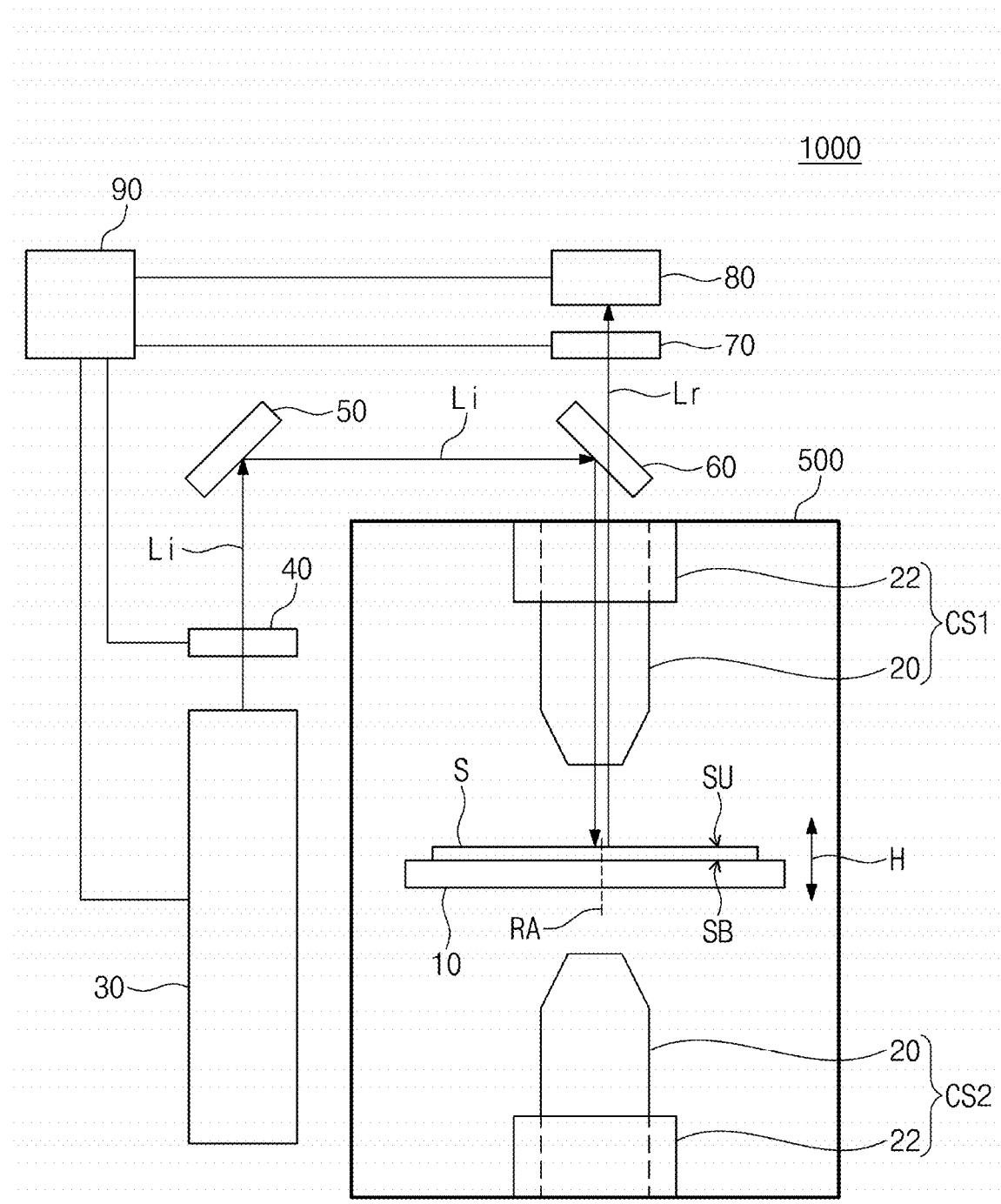
FIG. 1 is a schematic diagram illustrating a magnetic property measuring system according to some example embodiments of the inventive concepts.

FIG. 1 is a schematic diagram illustrating a magnetic property measuring system according to some example embodiments of the inventive concepts.

Referring to FIG. 1, a magnetic property measuring system 1000 may include a chamber 500, a stage 10, coil structures CS1 and CS2, a light source 30, and a detector 80. The chamber 500 may be configured to contain a sample S therein, and the stage 10 may be provided in the chamber 500 and may be configured to load the sample S. The coil structures CS1 and CS2 may be provided in the chamber 500 and may be configured to apply a magnetic field H to the sample S, the light source 30 may be configured to emit an incident light (e.g., an "incident light beam") Li toward the sample S, and the detector 80 may be used to detect a reflection light (e.g., a "reflection light beam") Lr reflected by the sample S. The magnetic property measuring system 1000 may further include a polarizer 40, a first optic member 50, a second optic member 60, and an analyzer 70. The polarizer 40 may be used to change polarization of the incident light Li emitted from the light source 30, the first optic member 50 and the second optic member 60 may be used to change a propagation path of the incident light Li, and the analyzer 70 may be used to change polarization of the reflection light Lr. The incident light Li may pass through the polarizer 40 and may then be irradiated onto a surface of the sample S, and the reflection light Lr may pass through the analyzer 70 and may then be detected by the detector 80. Restated, the light source 30 may be configured to emit an incident light beam Li toward the sample S, such that the incident light beam Li is incident to the sample S through the polarizer 40, the detector 80 may be configured to detect polarization of a reflection light beam Lr reflected from the sample S based on the incident light beam Li being emitted toward the sample S, and the detector 80 may be configured to receive the reflection light beam Lr through the analyzer 70.

The coil structures CS1 and CS2 may be configured to allow the magnetic field H to have a direction normal to the surface of the sample S. The sample S may have a top surface SU and a bottom surface SB facing each other. As an example, the magnetic field H exerted on the sample S may be substantially perpendicular (e.g., perpendicular within manufacturing tolerances and/or material tolerances) to the top and bottom surfaces SU and SB of the sample S. The coil structures CS1 and CS2 may be vertically spaced apart from each other with the sample S interposed therebetween. As an example, the coil structures CS1 and CS2 may include a first coil structure CS1, which is located adjacent to the top surface SU of the sample S, and a second coil structure CS2, which is located adjacent to the bottom surface SB of the sample S. As shown in at least FIG. 1, each coil structure of the coil structures CS1 and CS2 may include a pole piece 20 and a coil 22, where the coil encloses an outer circumference surface of the pole piece 20. The pole piece 20 may include a magnetic material.

The light source 30 may be configured to emit a laser beam. The light source 30 may be used as a single light source of the magnetic property measuring system 1000. The incident light Li may be polarized by the polarizer 40 and may be reflected by the first optic member 50 and the second optic member 60 to be incident to the sample S. The incident light Li may be perpendicularly incident to the top surface SU of the sample S, but the inventive concepts are not limited thereto. The incident light Li may be incident at an angle to the top surface SU of the sample S.

The detector 80 may be configured to detect polarization of the reflection light Lr reflected by the sample S. The reflection light Lr may be received by the detector 80 through the second optic member 60 and the analyzer 70, and here, a polarization state of the reflection light Lr may be changed by the analyzer 70.

The magnetic property measuring system 1000 may further include a controller 90 that is connected to the light source 30, the polarizer 40, the analyzer 70, and the detector 80. The controller 90 may be configured to control operations of the light source 30, the polarizer 40, and the analyzer 70 and to process detection data obtained by the detector 80. In the controller 90, the detection data may be processed to form various data (e.g., numerical, graphical, or image data), and the resultant data may be stored in a storage device or may be displayed on a display device. Although not shown, the controller 90 may also be connected to the stage 10 and may control motion of the stage 10.

The magnetic property measuring system 1000 may be configured to measure a perpendicular magnetic property of the sample S using a polar magneto-optical Kerr effect (MOKE). The MOKE may refer to a phenomenon in which polarization of light is changed when the light is reflected by a magnetic object. The polar MOKE may refer to a magneto-optical Kerr effect, which may occur when a magnetization direction of the object is parallel or substantially parallel (e.g., parallel within manufacturing tolerances and/or material tolerances) to a plane of incidence, to which the light is incident, and is perpendicular or substantially perpendicular (e.g., perpendicular within manufacturing tolerances and/or material tolerances) to a surface of the object. The magnetic property measuring system 1000 may be a polar MOKE measurement system and may be configured to analyze polarization of light (i.e., the reflection light Lr) reflected by the top surface SU of the sample S and to measure perpendicular magnetization of the surface of the sample S. For example, the detector 80 may measure the polarization of the reflection light Lr, and the controller 90 may analyze the polarization data of the reflection light Lr obtained by the detector 80 and may produce a magnetic hysteresis curve for the surface of the sample S, based on the analyzed polarization data.

Figure 2:
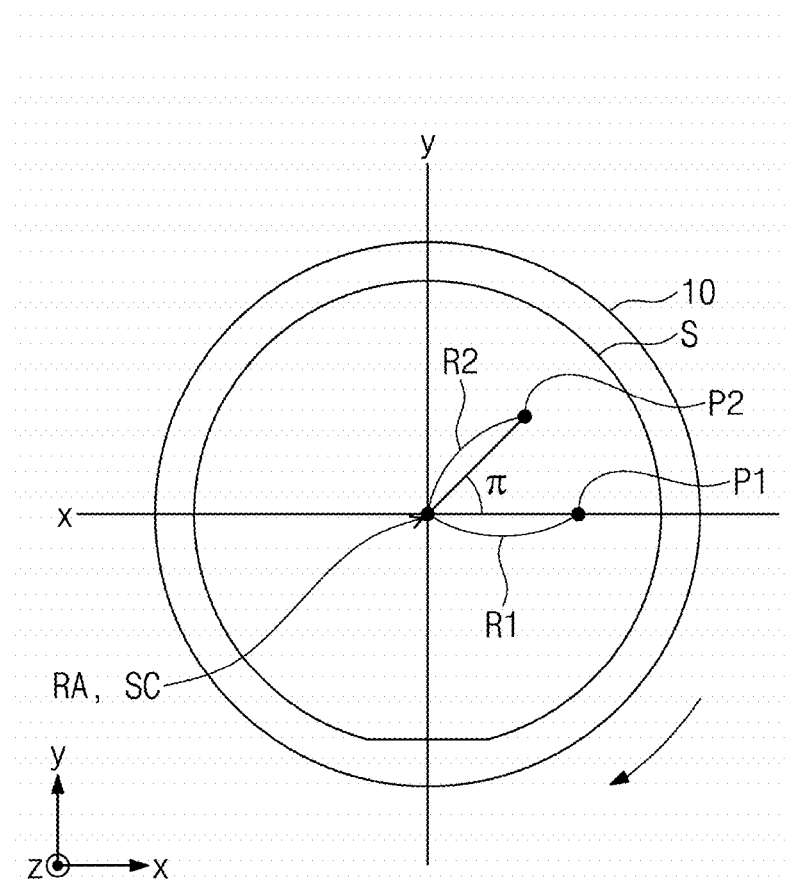
FIG. 2 is a plan view illustrating an operation of a stage of FIG. 1.
Figure 3:
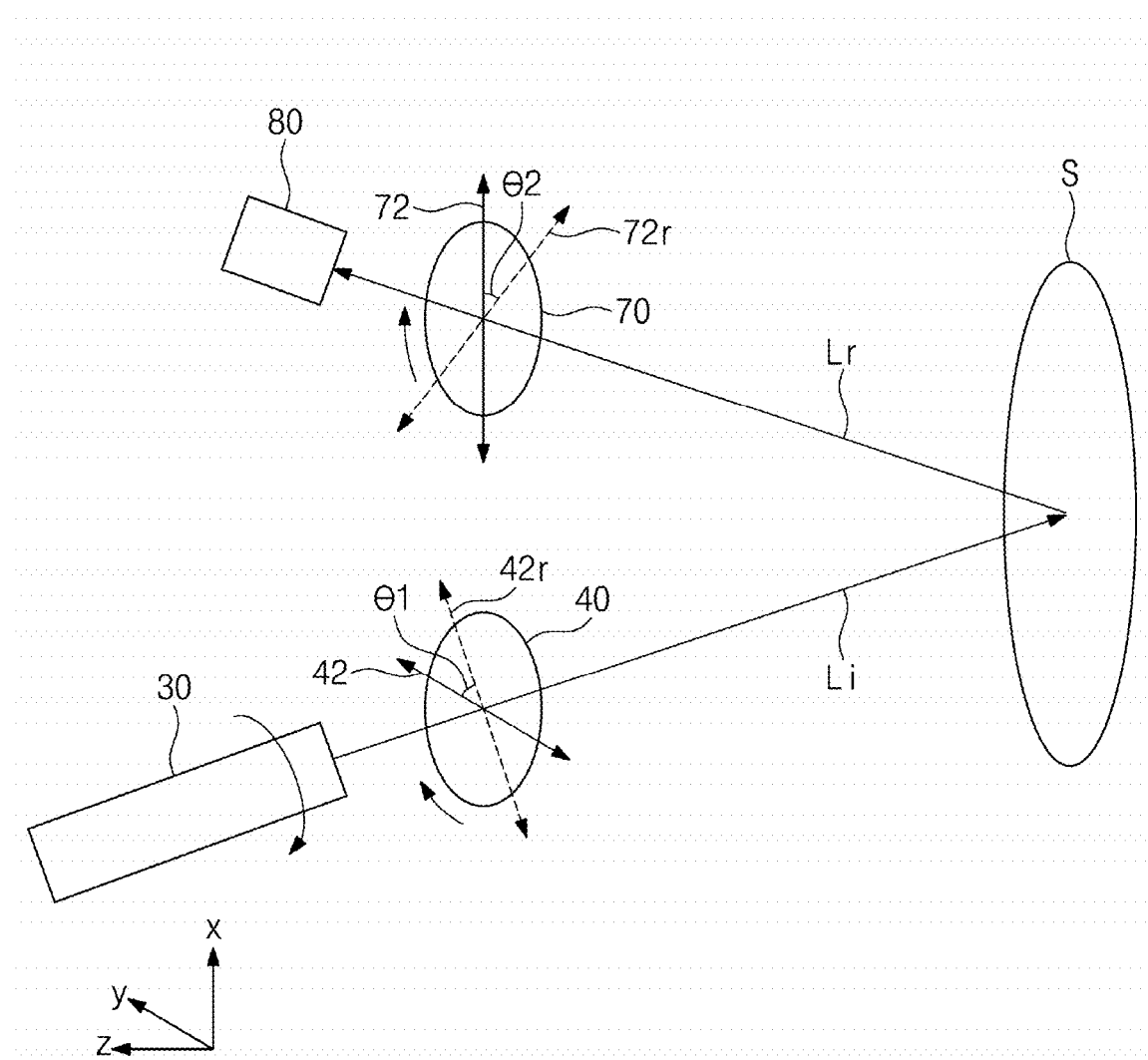
FIG. 3 is a schematic diagram illustrating operations of a light source, a polarizer, and an analyzer of FIG. 1.

FIG. 2 is a plan view illustrating an operation of a stage of FIG. 1, and FIG. 3 is a schematic diagram illustrating operations of a light source, a polarizer, and an analyzer of FIG. 1. For convenience in illustration, some of the elements constituting the magnetic property measuring system 1000 of FIG. 1 are omitted from FIGS. 2 and 3.

Referring to FIGS. 1 and 2, the stage 10 may be configured to move the sample S on an x-y or horizontal plane. Here, the x-y plane may be parallel or substantially parallel (e.g., parallel within manufacturing tolerances and/or material tolerances) to the top or bottom surface SU or SB of the sample S. In addition, the stage 10 may be configured to rotate the sample S about a rotation axis RA. As shown in at least FIGS. 1 and 2, the rotation axis RA may extend normal or substantially normal (e.g., normal within manufacturing tolerances and/or material tolerances) to the top surface SU of the sample S. The rotation axis RA may be chosen to be parallel or substantially parallel (e.g., parallel within manufacturing tolerances and/or material tolerances) to a z direction and to pass through a center SC of the top surface SU of the sample S. By using the stage 10, the sample S may be horizontally moved in a direction parallel or substantially parallel (e.g., parallel within manufacturing tolerances and/or material tolerances) to the x-y plane and may be rotated about the rotation axis RA.

For convenience in description, it may be assumed that, at an initial state of which the sample is loaded on the stage 10 and is not moved or rotated by the stage 10, i) the center SC of the top surface SU of the sample S may be aligned at an origin of an x-y coordinate system and ii) the incident light Li may be incident to a region corresponding to the origin of an x-y coordinate system. A first position P1 on the top surface SU of the sample S may be located on an x- or y-axis in the x-y coordinate system, and a second position P2 on the top surface SU of the sample S may be in the x-y coordinate system and may not be located on the x- and y-axes. To provide better understanding of the inventive concepts, FIG. 2 illustrates the top surface SU of the sample S projected on the x-y coordinate system, but the inventive concepts are not limited to the use of the x-y coordinate system.

When it is desired to measure a magnetic property of the sample S at the center SC of the top surface SU, the sample S may be aligned on the stage 10 in such a way that the center SC is located at the origin of the x-y coordinate system. In this case, the incident light Li may be incident to the center SC, and the reflection light Lr may be reflected from the center SC. An incidence plane of the incident light Li and the reflection light Lr may be a y-z plane. When it is desired to measure a magnetic property of the sample S at the first position P1, the sample S may be horizontally moved in the opposite x direction by a first distance R1. In this case, the sample S may be aligned on the stage 10 in such a way that the first position P1 is located at the origin of the x-y coordinate system. The incident light Li may be incident to the first position P1, and the reflection light Lr may be reflected from the first position P1. When it is desired to measure a magnetic property of the sample S at the second position P2, the sample S may be rotated clockwise by an angle of 7C and may be horizontally moved in the opposite x direction by a second distance R2. In this case, the sample S may be aligned on the stage 10 in such a way that the second position P2 is located at the origin of the x-y coordinate system. The incident light Li may be incident to the second position P2, and the reflection light Lr may be reflected from the second position P2.

When it is desired to measure a magnetic property of the sample S at a specific position, the sample S may be moved to a desired position through the afore-described translational and/or rotational motion of the stage 10. The controller 90 may control a translational and/or rotational motion of the stage 10 to place a target portion of the sample S at a desired position (for example, the origin of the x-y coordinate system).

Referring to FIGS. 2 and 3, the polarizer 40 may have ("may be associated with") a first polarization axis 42, and the analyzer 70 may have a second polarization axis 72. The second polarization axis 72 may be aligned to be perpendicular or substantially perpendicular (e.g., perpendicular within manufacturing tolerances and/or material tolerances) to the first polarization axis 42. In other words, the second polarization axis 72 may be perpendicular or substantially perpendicular (e.g., perpendicular within manufacturing tolerances and/or material tolerances) to the first polarization axis 42. If the sample S is rotated by a specific angle (e.g., $\pi$) (e.g., the stage 10 rotates the sample S about the rotation axis RA such that the stage 10 rotates the sample S by a particular rotation angle $\pi$), each of the polarizer 40 and the analyzer 70 may be configured to allow each of the first and second polarization axes 42 and 72 to be rotated by an angle that is dependent on the rotation angle $\pi$ of the sample S. Restated, the polarizer 40 and the analyzer 70 may be configured to enable the first and second polarization axes 42 and 72 to be independently rotated based on a rotation angle $\pi$ of the sample S. For example, in the case where the sample S is rotated by a specific angle (e.g., $\pi$), the first polarization axis 42 may be rotated clockwise or counterclockwise by a first angle $\theta 1$ based on the sample S being rotated by the specific angle, and the second polarization axis 72 may be rotated clockwise or counterclockwise by a second angle $\theta 2$ based on the sample S being rotated by the specific angle. Each angle of the first and second angles $\theta 1$ and $\theta 2$ may be in proportion to the rotation angle $\pi$ of the sample S. As an example, the first angle $\theta 1$ may be given by adding a specific angle ($\alpha$) to the rotation angle $\pi$ (i.e., $\theta 1 = \pi + \alpha$). Here, the specific angle ($\alpha$) may range from $-10°$ to $10°$. As an example, the first angle $\theta 1$ may be equal to the rotation angle $\pi$ of the sample S (i.e., $\alpha = 0$ and $\theta 1 = \pi$). The second angle $\theta 2$ may be given by adding a specific angle ($\beta$) to the rotation angle $\pi$ (i.e., $\theta 2 = \pi + \beta$). Here, the specific angle ($\beta$) may range from $-10°$ to $10°$. As an example, the second angle $\theta 2$ may be equal to the rotation angle $\pi$ of the sample S (i.e., $\beta = 0$ and $\theta 2 = \pi$).

The rotated second polarization axis 72r may be aligned to be perpendicular or substantially perpendicular (e.g., perpendicular within manufacturing tolerances and/or material tolerances) to a direction, to which the rotated first polarization axis 42r is aligned. In other words, the rotated second polarization axis 72r may be perpendicular or substantially perpendicular (e.g., perpendicular within manufacturing tolerances and/or material tolerances) to the rotated first polarization axis 42r.

In the case where it is desired to measure a magnetic property of the sample S at the center SC or the first position P1, the incident light Li may be polarized by the polarizer 40 having the first polarization axis 42 and may be incident to the center SC or the first position P1, and the reflection light Lr may be polarized by the analyzer 70 having the second polarization axis 72 and may be received by the detector 80. In the case where it is desired to measure a magnetic property of the sample S at the second position P2, the sample S may be rotated, and each of the first and second polarization axes 42 and 72 may be rotated depending on the rotation angle π of the sample S. In this case, the incident light Li may be polarized by the polarizer 40 having the rotated first polarization axis 42r and may be incident to the second position P2, and the reflection light Lr may be polarized by the analyzer 70 having the rotated second polarization axis 72r and may be received by the detector 80.

In some example embodiments, the light source 30 may be configured to be rotatable (e.g., rotated) about a rotation axis parallel or substantially parallel (e.g., parallel within manufacturing tolerances and/or material tolerances) to a propagation direction of the incident light Li. As shown in at least FIG. 3, the propagation direction of the incident light Li may be a direction from the light source 30 toward the polarizer 40. If the sample S is rotated by a specific angle (e.g., π), the light source 30 may be rotated depending on ("based on") the rotation angle π of the sample S. As an example, when the sample S is rotated, all of the light source 30, the polarizer 40, and the analyzer 70 may be rotated. In some example embodiments, when the sample S is rotated, the light source 30 may be fixed, but the polarizer 40 and the analyzer 70 may be rotated.

The controller 90 of FIG. 1 may control the polarizer 40 and the analyzer 70 to allow ("enable") each polarization axis of the first and second polarization axes 42 and 72 to be rotated depending on ("based on") the rotation angle π of the sample S. Furthermore, the controller 90 may control the light source 30 to allow the light source 30 to be rotated depending on the rotation angle π of the sample S.

A method of measuring a magnetic property of a sample using the magnetic property measuring system 1000 will be described in more detail below.

Figure 4:
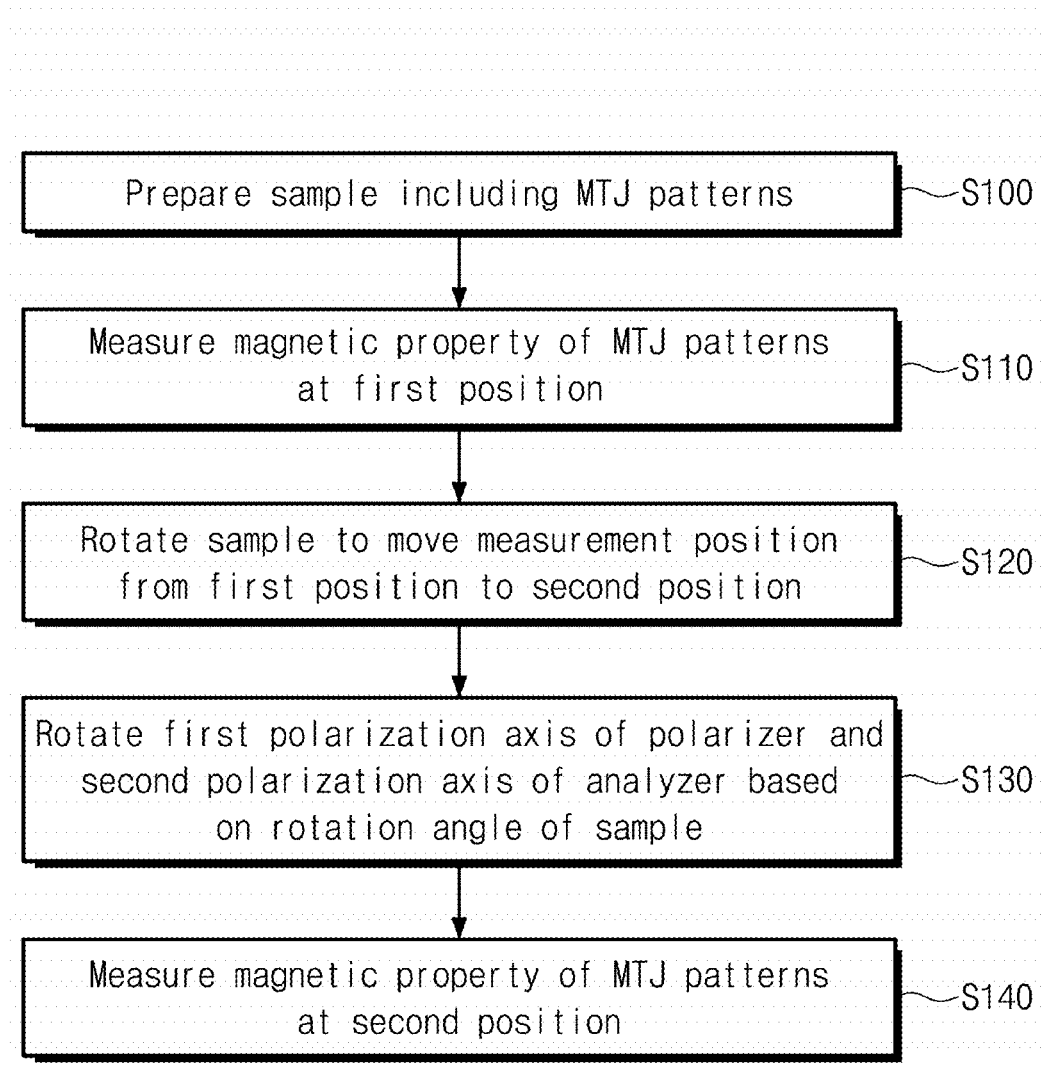
FIG. 4 is a flow chart illustrating a magnetic property measuring method according to some example embodiments of the inventive concepts.
Figure 5:
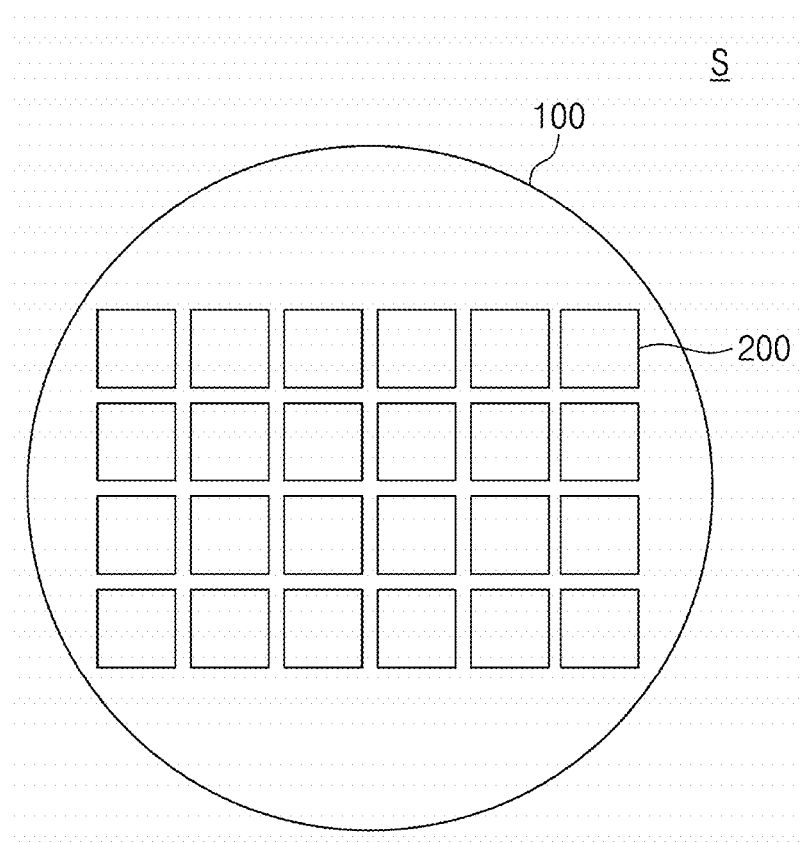
FIG. 5 is a plan view illustrating a sample, which is used for a magnetic property measuring method according to some example embodiments of the inventive concepts.
Figure 6:
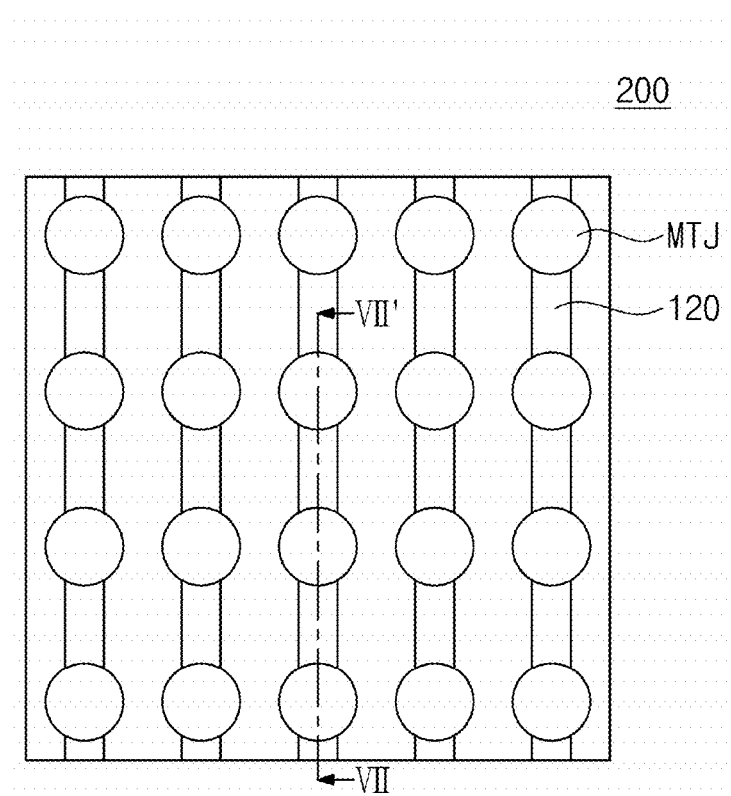
FIG. 6 is a plan view illustrating a region of the sample of FIG. 5.
Figure 7:
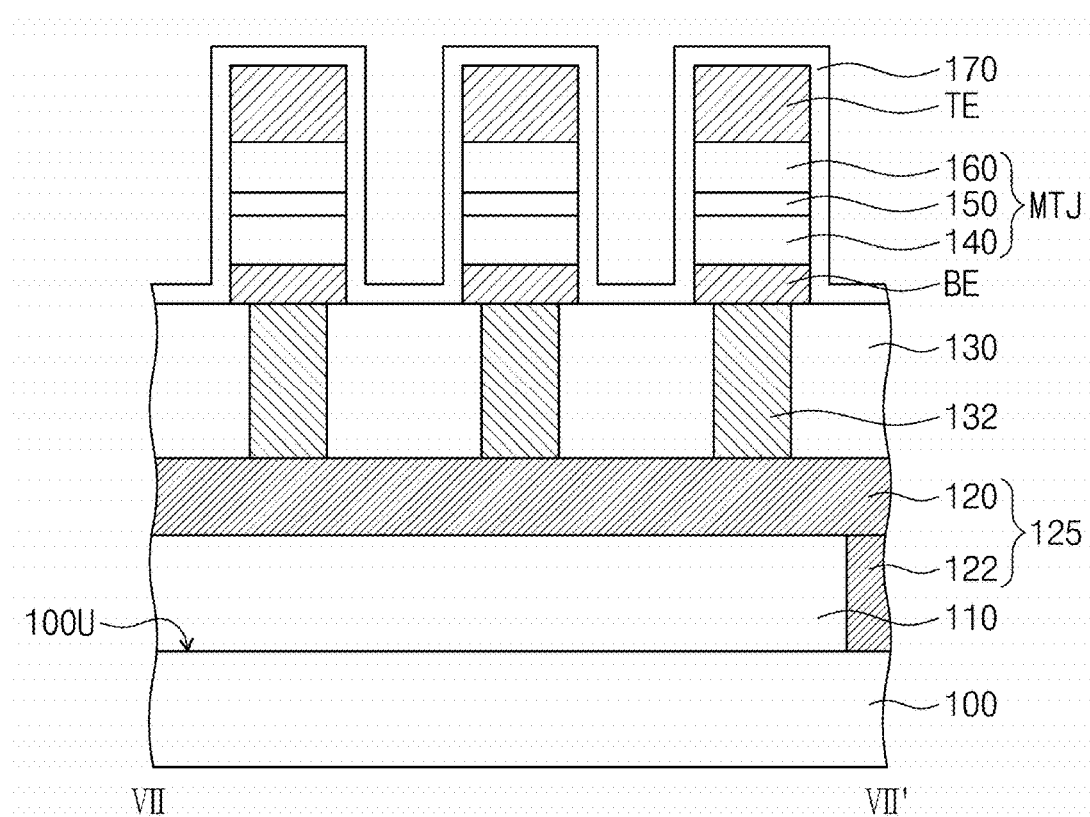
FIG. 7 is a sectional view taken along line VII-VII' of FIG. 6.
Figure 8:
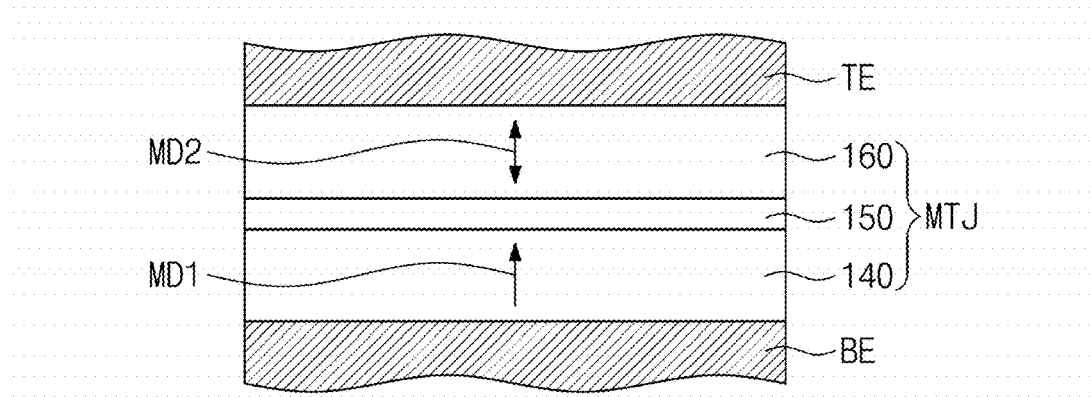
FIG. 8 is a sectional view illustrating a magnetic tunnel junction pattern of FIG. 7.
Figure 9:
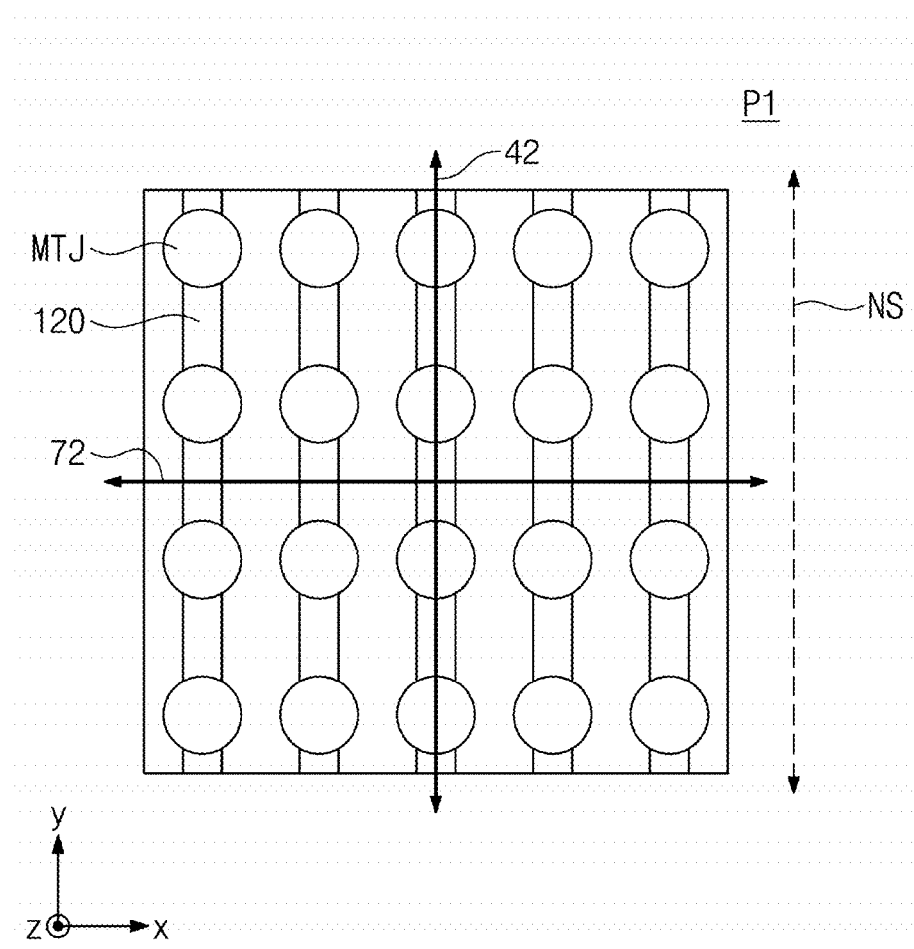
FIGS. 9 and 10 are plan views illustrating a magnetic property measuring method according to some example embodiments of the inventive concepts.
Figure 10:
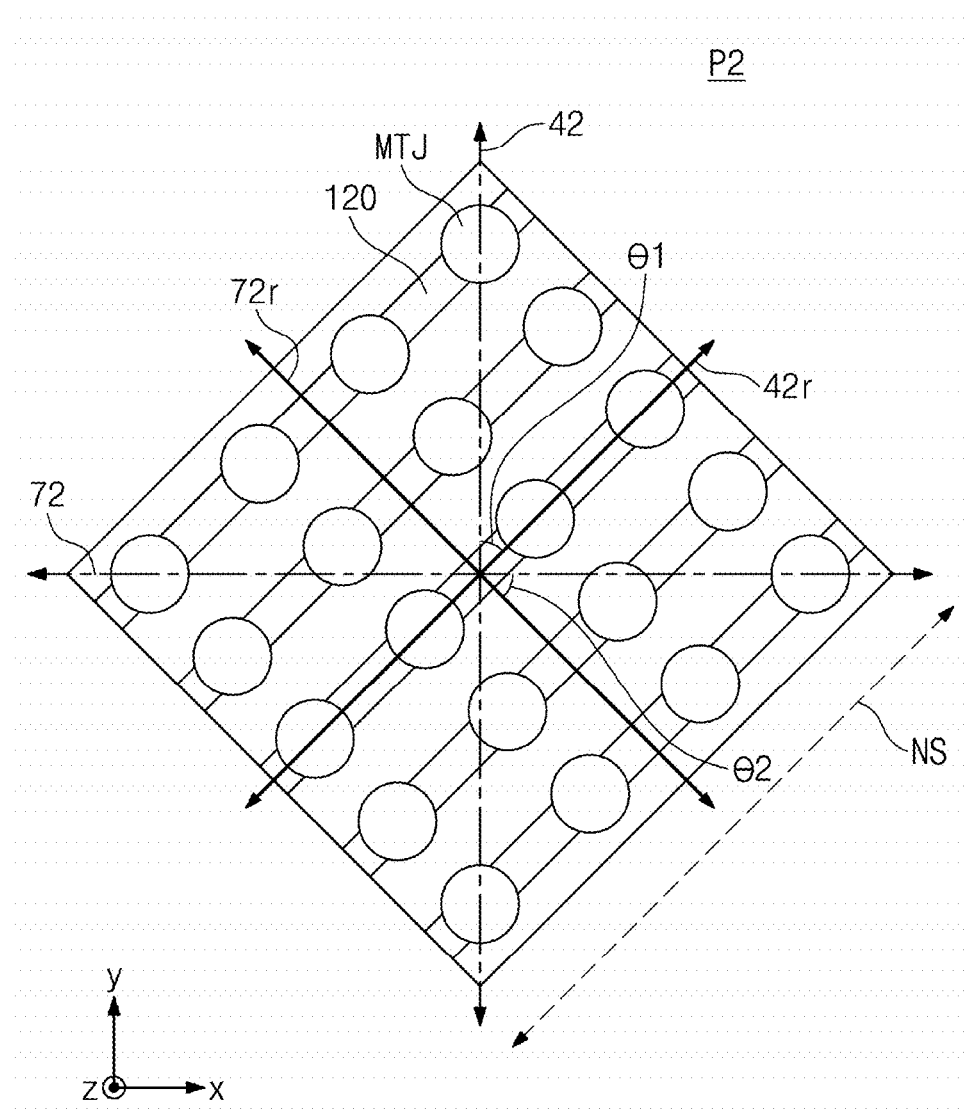
Figure 11:
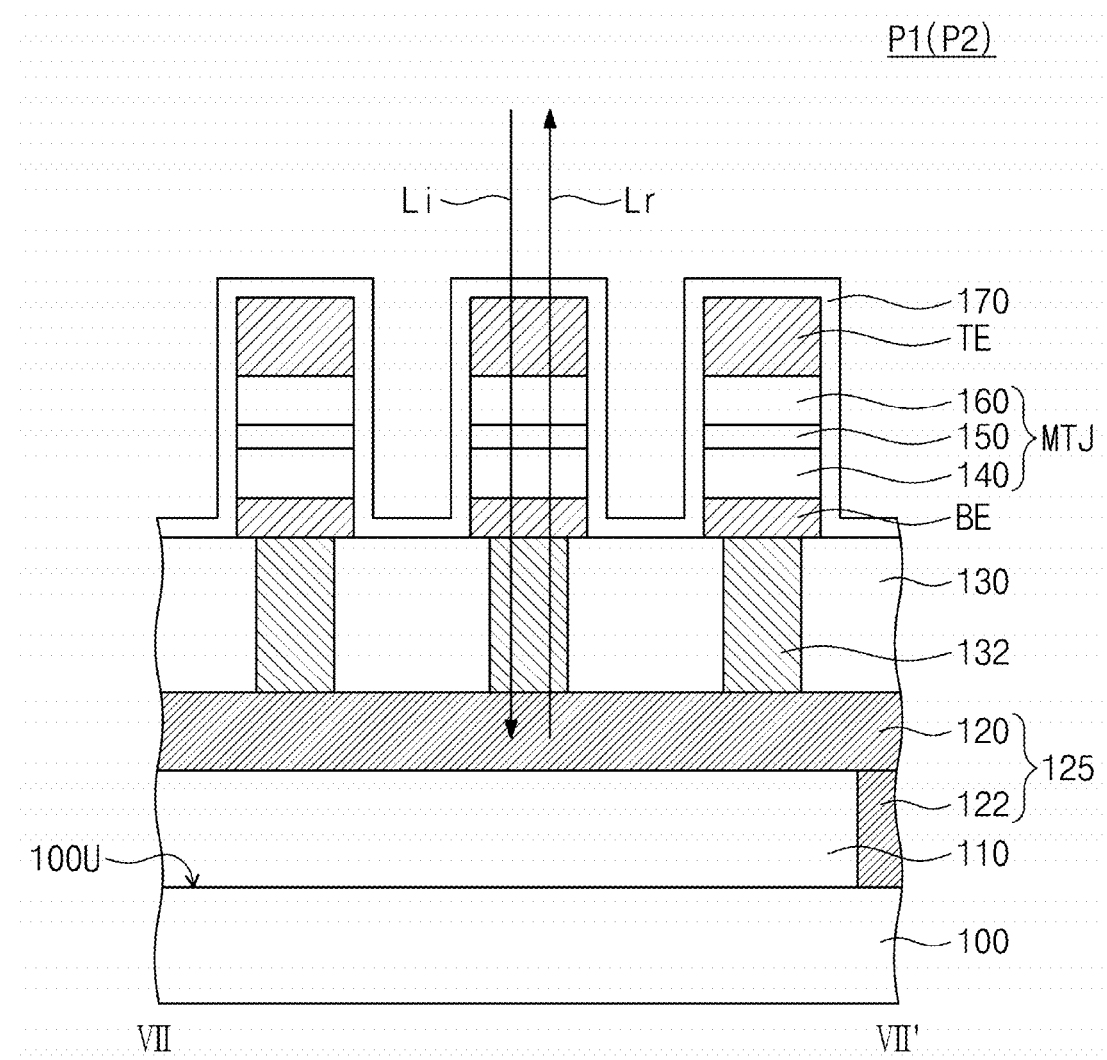
FIG. 11 is a sectional view, which is provided to illustrate a magnetic property measuring method according to some example embodiments of the inventive concepts and is taken along line VII-VII' of FIG. 6.

FIG. 4 is a flow chart illustrating a magnetic property measuring method according to some example embodiments of the inventive concepts. FIG. 5 is a plan view illustrating a sample, which is used for a magnetic property measuring method according to some example embodiments of the inventive concepts, and FIG. 6 is a plan view illustrating a region of the sample of FIG. 5. FIG. 7 is a sectional view taken along line VII-VII' of FIG. 6, and FIG. 8 is a sectional view illustrating a magnetic tunnel junction pattern of FIG. 7. FIGS. 9 and 10 are plan views illustrating a magnetic property measuring method according to some example embodiments of the inventive concepts, and FIG. 11 is a sectional view, which is provided to illustrate a magnetic property measuring method according to some example embodiments of the inventive concepts and is taken along line VII-VII' of FIG. 6.

Referring to FIGS. 4 and 5, a sample S including a plurality of magnetic tunnel junction patterns may be prepared (in S100). The sample S may include a substrate 100 with a plurality of chip regions 200. The plurality of magnetic tunnel junction patterns may be horizontally spaced apart from each other on the substrate 100 (e.g., spaced apart in a direction that extends parallel or substantially parallel (e.g., parallel within manufacturing tolerances and/or material tolerances) to a top surface 100U of the substrate 100). The substrate 100 may be a semiconductor substrate, such as silicon, silicon-on-insulator (SOI), silicon germanium (SiGe), germanium (Ge), and gallium arsenide (GaAs) wafers. Each of the chip regions 200 may include a memory region, in which a memory device is provided.

As referred to herein, an element that is "on" another element may be "above" or "beneath" the other element, and an element that is "on" another element may be "directly" or "indirectly" on the other element. An element that is directly on another element may be in direct contact with the other element. An element that is indirectly on another element may be isolated from direct contact with the other element by an interposing element or space.

Referring to FIGS. 6 to 8, a wiring structure 125 may be provided on each of the chip regions 200. The wiring structure 125 may include conductive lines 120, which are separated from the substrate 100, and contacts 122, which are connected to the conductive lines 120. The conductive lines 120 may be electrically connected to the substrate 100 through the contacts 122. Each of the conductive lines 120 may be a line-shaped pattern that are elongated in a specific direction (e.g., a first direction as shown in at least FIG. 6), when viewed in a plan view. The conductive lines 120 and the contacts 122 may be formed of or include a metallic material. For example, the conductive lines 120 and the contacts 122 may be formed of or include copper (Cu). A first interlayered insulating layer 110 may be provided on each of the chip regions 200 of the substrate 100 to cover the wiring structure 125. The first interlayered insulating layer 110 may be formed of or include at least one of oxide, nitride, or oxynitride.

A second interlayered insulating layer 130 may be provided on the first interlayered insulating layer 110, and bottom electrode contacts 132 may be provided in the second interlayered insulating layer 130. Each of the bottom electrode contacts 132 may penetrate the second interlayered insulating layer 130 and may be connected to a corresponding one of the conductive lines 120. The second interlayered insulating layer 130 may be formed of or include oxide, nitride, or oxynitride, and the bottom electrode contacts 132 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

Magnetic tunnel junction patterns MTJ may be provided on the second interlayered insulating layer 130. The magnetic tunnel junction patterns MTJ may be provided on each of the chip regions 200 of the substrate 100 to be horizontally spaced apart from each other. The magnetic tunnel junction patterns MTJ may be spaced apart from each other in a direction parallel or substantially parallel (e.g., parallel within manufacturing tolerances and/or material tolerances) to a top surface 100U of the substrate 100. The magnetic tunnel junction patterns MTJ may be connected to the bottom electrode contacts 132, respectively. A bottom electrode BE may be provided between each of the magnetic tunnel junction patterns MTJ and each of the bottom electrode contacts 132. A top electrode TE may be provided on each of the magnetic tunnel junction patterns MTJ and may be spaced apart from the bottom electrode BE with each of the magnetic tunnel junction patterns MTJ interposed therebetween. The bottom and top electrodes BE and TE may include a conductive material. As an example, the bottom and top electrodes BE and TE may be formed of or include at least one of conductive metal nitrides (e.g., titanium nitride or tantalum nitride).

Each of the magnetic tunnel junction patterns MTJ may include a first magnetic pattern 140, a second magnetic pattern 160, and a tunnel barrier pattern 150 therebetween. One of the first and second magnetic patterns 140 and 160 may be a reference layer, whose magnetization direction is fixed, and the other may be a free layer whose magnetization direction can be switched to one of at least two stable directions. The first and second magnetic patterns 140 and 160 may have magnetization directions MD1 and MD2, respectively, which are substantially perpendicular to an interface between the first magnetic pattern 140 and the tunnel barrier pattern 150. The magnetization directions MD1 and MD2 of the first and second magnetic patterns 140 and 160 may be substantially perpendicular to the top surface 100U of the substrate 100. Although FIG. 8 illustrates an example, in which the first magnetic pattern 140 is used as a reference layer having a fixed magnetization direction MD1 and the second magnetic pattern 160 is used as a free layer having a switchable magnetization direction MD2, but the inventive concepts are not limited thereto. Unlike that illustrated in the drawings, the first magnetic pattern 140 may be configured to serve as the free layer having a switchable magnetization direction, and the second magnetic pattern 160 may be configured to serve as the reference layer having a fixed magnetization direction.

Each of the first and second magnetic patterns 140 and 160 may include at least one of an intrinsic perpendicular magnetic material or an extrinsic perpendicular magnetic material. The intrinsic perpendicular magnetic material may include a material exhibiting a perpendicular magnetization property, even when there is no external cause. The intrinsic perpendicular magnetic material may include at least one of i) perpendicular magnetic materials (e.g., CoFeTb, CoFeGd, and CoFeDy), ii) perpendicular magnetic materials with L10 structure, iii) CoPt-based materials with hexagonal-close-packed structure, or iv) perpendicular magnetic structures. The perpendicular magnetic material with the L10 structure may include at least one of L10 FePt, L10 FePd, L10 CoPd, or L10 CoPt. The perpendicular magnetic structures may include magnetic layers and non-magnetic layers that are alternatingly and repeatedly stacked. For example, the perpendicular magnetic structures may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the stacking number. The extrinsic perpendicular magnetic material may include a material, which exhibits an intrinsic in-plane magnetization property when there is no external cause but exhibits a perpendicular magnetization property by an external cause. For example, a magnetic anisotropy, which results from interfacial characteristics between the first or second magnetic pattern 140 or 160 and the tunnel barrier pattern 150, may be used to induce the perpendicular magnetization property of the extrinsic perpendicular magnetic material. For example, the extrinsic perpendicular magnetic material may include CoFeB. The tunnel barrier pattern 150 may be formed of or include at least one of magnesium oxide, titanium oxide, aluminum oxide, magnesium-zinc oxide, magnesium-boron oxide, titanium nitride, or vanadium nitride.

A protection layer 170 may be provided on the second interlayered insulating layer 130 to cover the magnetic tunnel junction patterns MTJ and the top and bottom electrodes TE and BE. The protection layer 170 may be formed of or include silicon nitride.

The first and second magnetic patterns 140 and 160 may be configured to have perpendicular-to-plane magnetization directions MD1 and MD2, and thus, the magnetic tunnel junction patterns MTJ may be perpendicular-type magnetic tunnel junction patterns. The magnetic property measuring system 1000 of FIG. 1 may be a polar MOKE measurement system and may be used to measure a perpendicular magnetic property of the perpendicular-type magnetic tunnel junction pattern.

Referring back to FIGS. 4 and 5, the sample S may include the substrate 100 and the magnetic tunnel junction patterns MTJ provided on the substrate 100.

Referring to FIGS. 1, 2, and 4, the sample S may be provided in the chamber 500 of the magnetic property measuring system 1000 and may be loaded on the stage 10. The sample S may be aligned on the stage 10 in such a way that the center SC of the sample S is located at the origin of the x-y coordinate system. The magnetic field H may be applied to the sample S. The magnetic field H may be substantially perpendicular to the top and bottom surfaces SU and SB of the sample S. When it is desired to measure a magnetic property of the sample S at the first position P1, the sample S may be horizontally moved in the opposite x direction by the first distance R1. Thereafter, a magnetic property of the magnetic tunnel junction patterns MTJ of the sample S may be measured at the first position P1 (in S110).

Referring to FIGS. 3, 9, and 11, the top surface SU of the sample S may correspond to the top surface 100U of the substrate 100. In other words, the magnetic field H may be applied to the top surface 100U of the substrate 100 in a direction normal to the top surface 100U, and thus, the first and second magnetic patterns 140 and 160 may have magnetizations that are substantially perpendicular to the top surface 100U of the substrate 100. In other words, the magnetic tunnel junction patterns MTJ may have perpendicular magnetic properties.

The measuring of the magnetic property of the magnetic tunnel junction patterns MTJ at the first position P1 may include irradiating the incident light Li onto the first position P1 and detecting polarization of the reflection light Lr reflected from the first position P1 based on the irradiating. At the first position P1, an incidence plane of the incident light Li and the reflection light Lr may be the y-z plane, and the conductive lines 120 may extend in the y direction. In other words, the extension direction of the conductive lines 120 may be a first direction that is parallel or substantially parallel (e.g., parallel within manufacturing tolerances and/or material tolerances) to the incidence or y-z plane. The incident light Li may be polarized by (e.g., may pass through) the polarizer 40 having the first polarization axis 42 and may be incident to the first position P1. At the first position P1, the first polarization axis 42 may be aligned to be parallel or substantially parallel (e.g., parallel within manufacturing tolerances and/or material tolerances) to the incidence or y-z plane. The reflection light Lr reflected from the first position P1 may be polarized by (e.g., may pass through) the analyzer 70 having the second polarization axis 72 and may be received by the detector 80 through the analyzer 70. At the first position P1, the second polarization axis 72 may be aligned to be perpendicular or substantially perpendicular (e.g., perpendicular within manufacturing tolerances and/or material tolerances) to the incidence or y-z plane. In other words, the second polarization axis 72 may be perpendicular or substantially perpendicular (e.g., perpendicular within manufacturing tolerances and/or material tolerances) to the first polarization axis 42.

The reflection light Lr may include a polarized signal light, which is reflected from the magnetic tunnel junction patterns MTJ, and a polarized noise light, which is reflected from underlying patterns (e.g., the conductive lines 120) below the magnetic tunnel junction patterns MTJ. The polarized noise light may have a polarization direction NS that is substantially parallel to the extension direction of the conductive lines 120. That is, at the first position P1, the polarization direction NS of the polarized noise light may be substantially parallel to the incidence or y-z plane and may be perpendicular or substantially perpendicular (e.g., perpendicular within manufacturing tolerances and/or material tolerances) to the second polarization axis 72. In this case, when the reflection light Lr passes through the analyzer 70 having the second polarization axis 72, the polarized noise light in the reflection light Lr may be filtered by the analyzer 70, and the polarized signal light in the reflection light Lr may be received by the detector 80 through the analyzer 70. That is, it may be possible to reduce noise in the magnetic property measuring system 1000 and to effectively measure a magnetic property of the magnetic tunnel junction patterns MTJ at the first position P1.

Referring to FIGS. 2, 3, and 4, the sample S may be rotated to move a measurement position, to which the incident light Li is incident, from the first position P1 to the second position P2 (in S120). Restated, the sample S may be rotated about a rotation axis RA that is normal to the surface (e.g., SU) of the sample S to move a measurement portion from the first portion to a second position on the sample S. To measure a magnetic property of the sample S at the second position P2, the sample S may be rotated clockwise by an rotation angle of $\pi$ and may be horizontally moved in the opposite x direction by the second distance R2. The first polarization axis 42 of the polarizer 40 and the second polarization axis 72 of the analyzer 70 may be rotated depending on ("based on") the rotation angle $\pi$ of the sample S (in S130). In detail, as described with reference to FIGS. 2 and 3, the first polarization axis 42 may be rotated by the first angle $\theta 1$, and the second polarization axis 72 may be rotated by the second angle $\theta 2$. Each of the first and second angles $\theta 1$ and $\theta 2$ may be in proportion to the rotation angle $\pi$ of the sample S. Thereafter, a magnetic property of the magnetic tunnel junction patterns MTJ of the sample S may be measured at the second position P2 (in S140). In some example embodiments, the measuring the magnetic property of the magnetic tunnel junction patterns at the first position and the second position (S120 and S140) each includes producing a magnetic hysteresis curve for the magnetic tunnel junction patterns using a polar MOKE.

Referring to FIGS. 3, 10, and 11, in the case where the magnetic field H has a direction perpendicular or substantially perpendicular (e.g., perpendicular within manufacturing tolerances and/or material tolerances) to the top surface 100U of the substrate 100, the magnetic tunnel junction patterns MTJ may exhibit a perpendicular magnetic property. The measuring of the magnetic property of the magnetic tunnel junction patterns MTJ at the second position P2 may include irradiating the incident light Li (e.g., irradiating a separate incident light beam Li) onto the second position P2 and detecting polarization of the reflection light Lr reflected from the second position P2 (e.g., detecting polarization of a separate reflection light beam Lr reflected from the second position P2 based on the irradiating of the separate incident light beam Li). At the second position P2, an incidence plane of the incident light Li and the reflection light Lr may be the y-z plane. As a result of the rotation of the sample S, the conductive lines 120 may be placed to have an extension direction that is not parallel or substantially parallel (e.g., parallel within manufacturing tolerances and/ or material tolerances) to the y direction. In other words, the extension direction (e.g., first direction) of the conductive lines 120 may be inclined to the incidence or y-z plane.

The incident light Li (e.g., the separate incident light beam Li) may be polarized by (e.g., may pass through) the polarizer 40 having the rotated first polarization axis 42r and may be incident to the second position P2. Since the first polarization axis 42 is rotated by the first angle $\theta 1$, the rotated first polarization axis 42r at the second position P2 may be aligned to be inclined to the incidence or y-z plane. As an example, the rotated first polarization axis 42r may be aligned to be parallel or substantially parallel (e.g., parallel within manufacturing tolerances and/or material tolerances) to the extension direction of the conductive lines 120. The reflection light Lr (e.g., the separate reflection light beam Lr) reflected from the second position P2 may be polarized by (e.g., may pass through) the analyzer 70 having the rotated second polarization axis 72r and may be received by the detector 80 through the analyzer 70. Since the second polarization axis 72 is rotated by the second angle $\theta 2$, the rotated second polarization axis 72r at the second position P2 may be aligned to be inclined to the incidence or y-z plane. The rotated second polarization axis 72r may be (e.g., may be aligned to be) perpendicular or substantially perpendicular (e.g., perpendicular within manufacturing tolerances and/or material tolerances) to the rotated first polarization axis 42r.

As described above, the polarization direction NS of the polarized noise light may be substantially parallel to the extension direction of the conductive lines 120. Thus, at the second position P2, the polarization direction NS of the polarized noise light may be inclined to the incidence or y-z plane and may be substantially perpendicular to the rotated second polarization axis 72r. In this case, when the reflection light Lr passes through the analyzer 70 having the rotated second polarization axis 72r, the polarized noise light in the reflection light Lr may be filtered by the analyzer 70, and the polarized signal light in the reflection light Lr may be received by the detector 80 through the analyzer 70. Thus, it may be possible to reduce noise in the magnetic property measuring system 1000 and to effectively measure a magnetic property of the magnetic tunnel junction patterns MTJ at the second position P2.

In the case where the sample S is rotated but the first polarization axis 42 of the polarizer 40 and the second polarization axis 72 of the analyzer 70 are fixed, the incident light Li may be polarized by the polarizer 40 having the first polarization axis 42 and may be incident to the second position P2, and the reflection light Lr reflected from the second position P2 may be polarized by the analyzer 70 having the second polarization axis 72 and may be received by the detector 80. The first polarization axis 42 may be aligned to be parallel or substantially parallel (e.g., parallel within manufacturing tolerances and/or material tolerances) to the incidence or y-z plane, and the second polarization axis 72 may be aligned to be perpendicular or substantially perpendicular (e.g., perpendicular within manufacturing tolerances and/or material tolerances) to the incidence or y-z plane. As a result of the rotation of the sample S, the extension direction of the conductive lines 120 at the second position P2 may be inclined to the incidence or y-z plane, and thus, the polarization direction NS of the polarized noise light may be inclined to the incidence or y-z plane and the second polarization axis 72. In this case, when the reflection light Lr passes through the analyzer 70 having the second polarization axis 72, at least a portion of the polarized noise light may be received by the detector 80 through the analyzer 70. This may lead to an increase of noise in the magnetic property measuring system 1000, and thus, it may be difficult to effectively measure a magnetic property of the magnetic tunnel junction patterns MTJ at the second position P2.

According to some example embodiments of the inventive concepts, the first polarization axis 42 of the polarizer 40 and the second polarization axis 72 of the analyzer 70 may be rotated depending on the rotation angle π of the sample S. The rotated second polarization axis 72r may be aligned to be substantially perpendicular to the polarization direction NS of the polarized noise light. Accordingly, the polarized noise light in the reflection light Lr may be filtered by the analyzer 70, and the polarized signal light in the reflection light Lr may be received by the detector 80 through the analyzer 70. Thus, it may be possible to reduce noise in the magnetic property measuring system 1000 and to effectively measure a magnetic property of the magnetic tunnel junction patterns MTJ.

Figure 12:
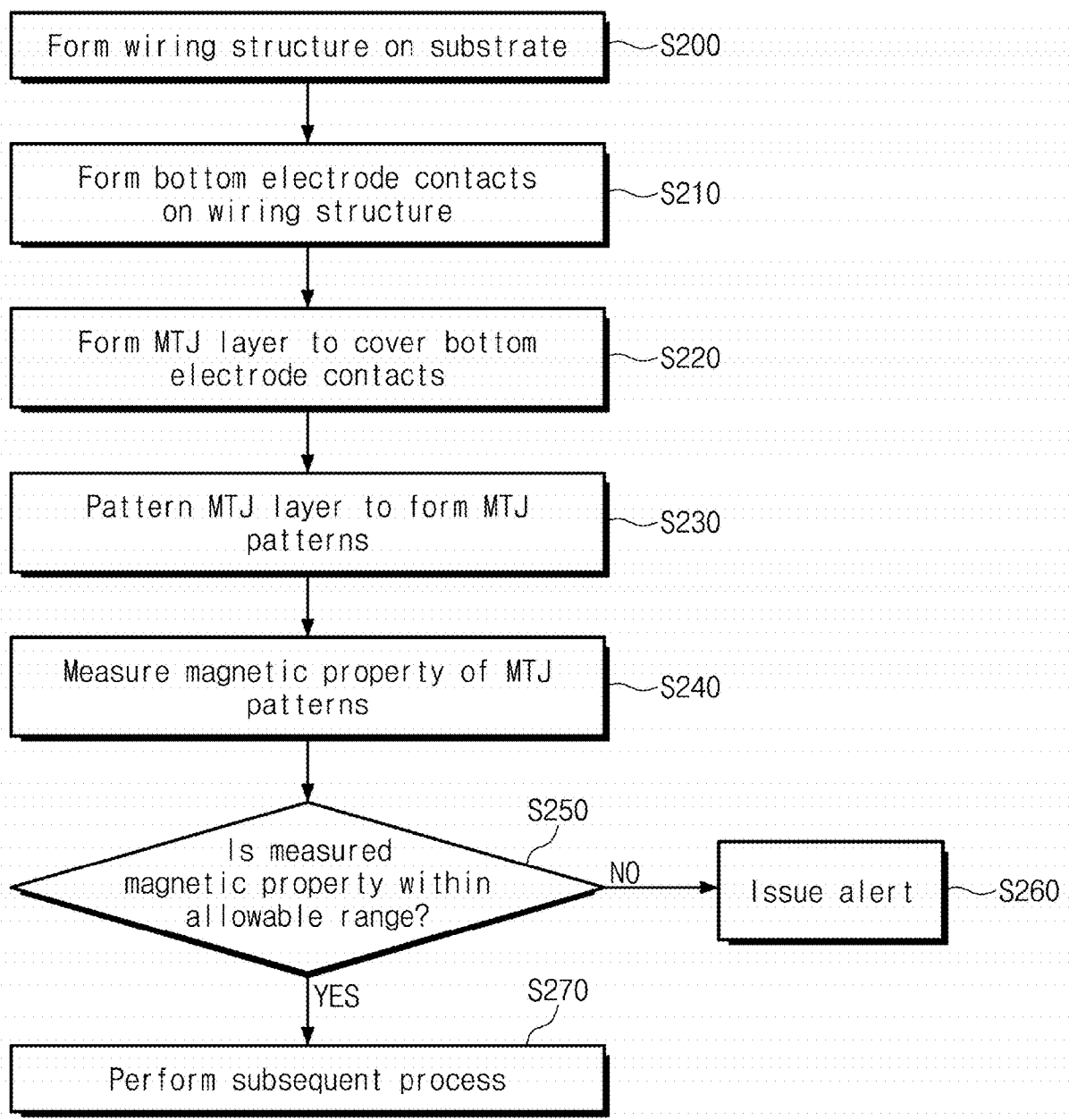
FIG. 12 is a flow chart illustrating a method of fabricating a magnetic memory device using a magnetic property measuring system according to some example embodiments of the inventive concepts.
Figure 13:
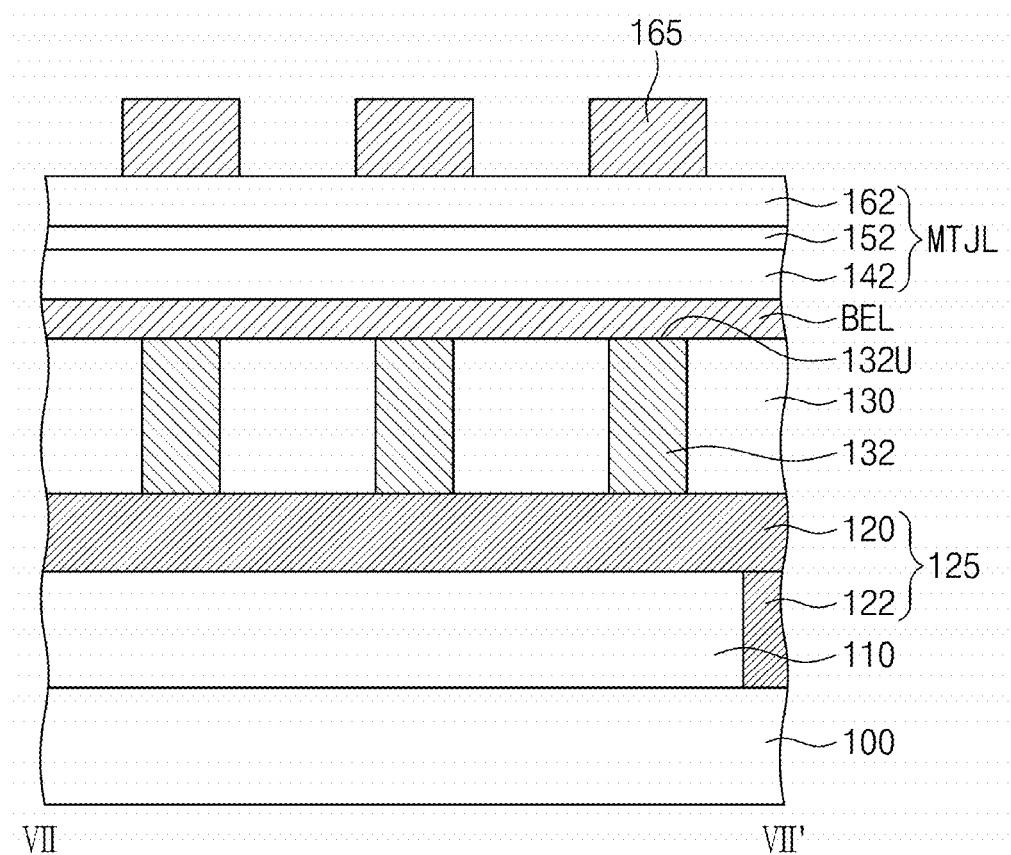
FIGS. 13 to 15 are sectional views, which are provided to illustrate a method of fabricating a magnetic memory device using a magnetic property measuring system according to some example embodiments of the inventive concepts and are taken along line VII-VII' of FIG. 6.
Figure 14:
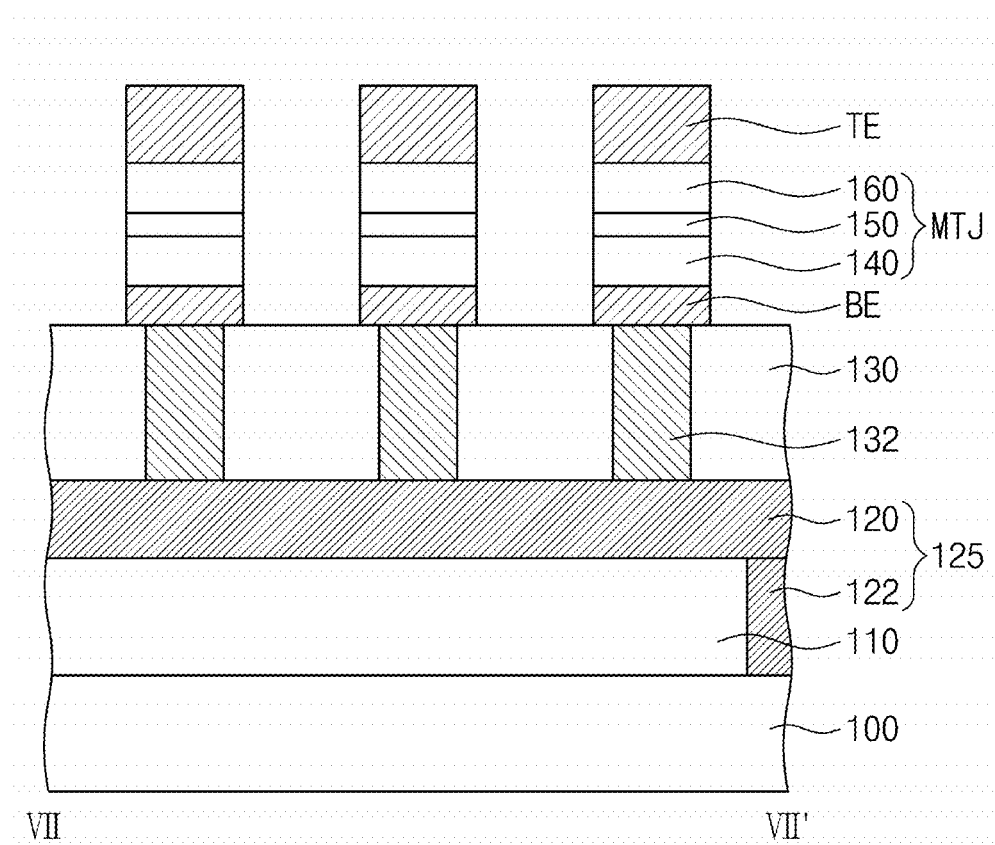
Figure 15:
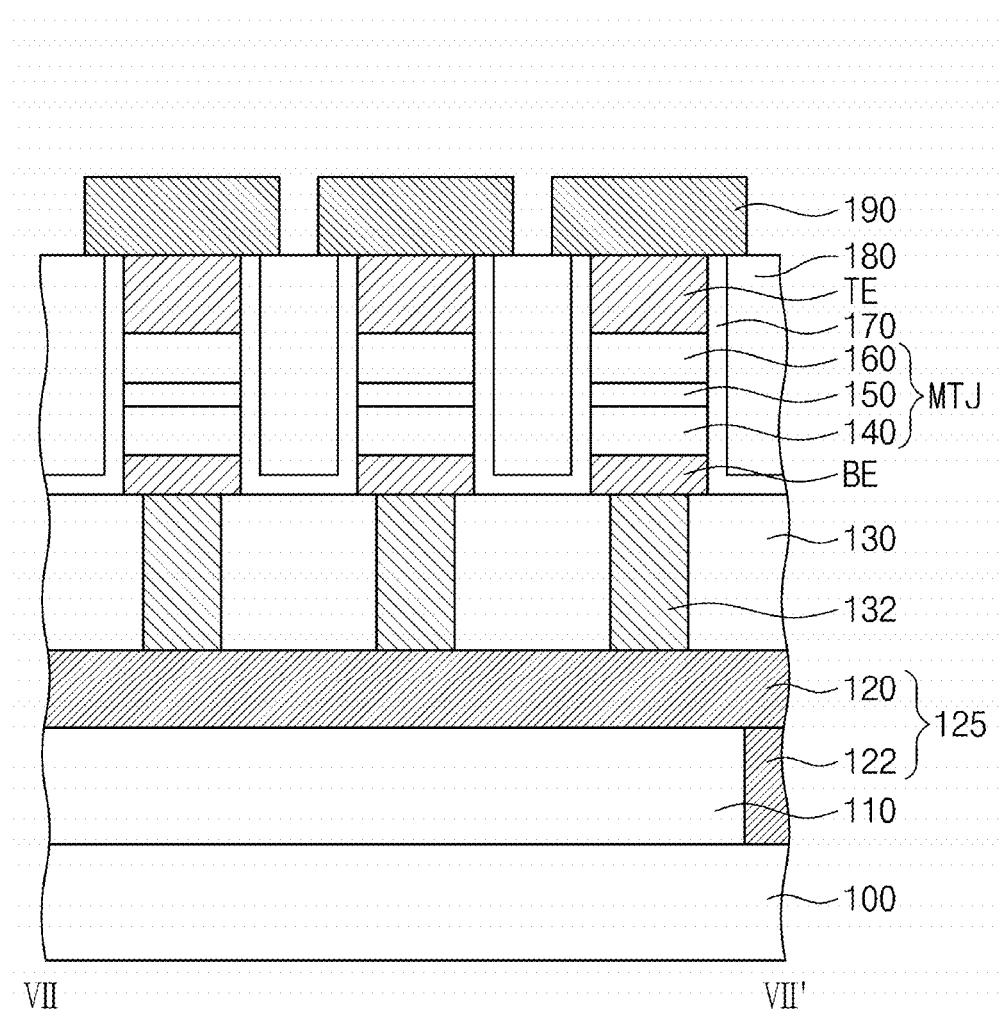

FIG. 12 is a flow chart illustrating a method of fabricating a magnetic memory device using a magnetic property measuring system according to some example embodiments of the inventive concepts. FIGS. 13 to 15 are sectional views, which are provided to illustrate a method of fabricating a magnetic memory device using a magnetic property measuring system according to some example embodiments of the inventive concepts and are taken along line VII-VII' of FIG. 6.

Referring to FIGS. 12 and 13, selection elements (not shown) may be formed on the chip regions 200, respectively, of the substrate 100. The substrate 100 may be a semiconductor substrate, such as silicon, silicon-on-insulator (SOI), silicon germanium (SiGe), germanium (Ge), and gallium arsenide (GaAs) wafers. The selection elements may be field effect transistors or diodes. Thereafter, the wiring structure 125 may be formed on the substrate 100 (in S200). The wiring structure 125 may be electrically connected to the substrate 100. The wiring structure 125 may include the conductive lines 120, which are separated from the substrate 100, and the contacts 122, which are connected to the conductive lines 120. The conductive lines 120 may be electrically connected to the substrate 100 through the contacts 122. At least one of the conductive lines 120 may be electrically connected to a terminal of a corresponding selection element through a corresponding one of the contacts 122. The conductive lines 120 and the contacts 122 may be formed of or include a metallic material. For example, the conductive lines 120 and the contacts 122 may be formed of or include copper (Cu). The first interlayered insulating layer 110 may be formed on the substrate 100 to cover the selection elements and the wiring structure 125. The first interlayered insulating layer 110 may be a single- or multi-layered structure including at least one of an oxide layer, a nitride layer, or an oxynitride layer.

Bottom electrode contacts 132 may be formed on the wiring structure 125 (in S210). Each of the bottom electrode contacts 132 may be electrically coupled to a terminal of a corresponding one of the selection elements through a corresponding one of the conductive lines 120. The bottom electrode contacts 132 may be formed of or include at least one of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide). The second interlayered insulating layer 130 may be formed on the first interlayered insulating layer 110 to cover the bottom electrode contacts 132. The second interlayered insulating layer 130 may be a single- or multi-layered structure including at least one of an oxide layer, a nitride layer, or an oxynitride layer.

A bottom electrode layer BEL and a magnetic tunnel junction layer MTJL may be formed on the second interlayered insulating layer 130 to cover top surfaces 132U of the bottom electrode contacts 132 (in S220), such that the magnetic tunnel junction layer MTJL is formed on the substrate 100 and the bottom electrode contacts 132 are formed on the wiring structure 125 prior to the forming of the magnetic tunnel junction layer MTJL. The bottom electrode layer BEL may be interposed between the second interlayered insulating layer 130 and the magnetic tunnel junction layer MTJL. The bottom electrode layer BEL may be formed of or include at least one of conductive metal nitrides (e.g., titanium nitride or tantalum nitride). The magnetic tunnel junction layer MTJL may include a first magnetic layer 142, a tunnel barrier layer 152, and a second magnetic layer 162, which are sequentially stacked on the bottom electrode layer BEL. Each of the first magnetic layer 142 and the second magnetic layer 162 may include at least one of the intrinsic and extrinsic perpendicular magnetic materials described above. The tunnel barrier layer 152 may be formed of or include at least one of magnesium oxide, titanium oxide, aluminum oxide, magnesium-zinc oxide, magnesium-boron oxide, titanium nitride, or vanadium nitride.

Conductive mask patterns 165 may be formed on the magnetic tunnel junction layer MTJL. The conductive mask patterns 165 may be used to define positions and shapes of magnetic tunnel junction patterns to be described below. The conductive mask patterns 165 may be formed of or include at least one of conductive metal nitrides (e.g., titanium nitride or tantalum nitride).

Referring to FIGS. 12 and 14, the magnetic tunnel junction layer MTJL and the bottom electrode layer BEL may be sequentially patterned using the conductive mask patterns 165 as an etch mask to form magnetic tunnel junction patterns MTJ and bottom electrodes BE (in S230). Each of the conductive mask patterns 165 may be used as the top electrode TE. Each of the magnetic tunnel junction patterns MTJ may include the first magnetic pattern 140, the tunnel barrier pattern 150, and the second magnetic pattern 160, which are sequentially stacked on each of the bottom electrodes BE, such that the tunnel barrier pattern 150 is between the first magnetic pattern 140 and the second magnetic pattern 160. The magnetic tunnel junction patterns MTJ may be spaced apart from each other in a direction parallel or substantially parallel (e.g., parallel within manufacturing tolerances and/or material tolerances) to the top surface of the substrate 100, and the bottom electrodes BE may be provided below the magnetic tunnel junction patterns MTJ, respectively. Thereafter, as shown in FIG. 7, the protection layer 170 may be formed on the second interlayered insulating layer 130 to cover side surfaces of the magnetic tunnel junction patterns MTJ and side surfaces of the bottom electrodes BE. The protection layer 170 may cover side and top surfaces of the top electrodes TE. The protection layer 170 may be formed of or include silicon nitride.

Referring to FIG. 12, a magnetic property of the magnetic tunnel junction patterns MTJ may be measured, after the formation of the magnetic tunnel junction patterns MTJ (in S240). The magnetic property of the magnetic tunnel junction patterns MTJ may be measured using the magnetic property measuring system 1000 described with reference to FIGS. 1 to 3.

In detail, referring back to FIG. 4, the sample S may be prepared to include the substrate 100 provided with the magnetic tunnel junction patterns MTJ (in S100), and then, the sample S may be disposed in the chamber 500 of the magnetic property measuring system 1000 of FIG. 1. A magnetic property of the magnetic tunnel junction patterns MTJ of the sample S may be measured at the first position P1 (in S110). As described with reference to FIGS. 3, 9, and 11, to measure a magnetic property of the magnetic tunnel junction patterns MTJ at the first position P1, the incident light Li may be polarized by the polarizer 40 having the first polarization axis 42 and may be incident to the first position P1, and the reflection light Lr reflected from the first position P1 may be polarized by the analyzer 70 having the second polarization axis 72 and may be received by the detector 80. Thus, it may be possible to effectively measure a magnetic property of the magnetic tunnel junction patterns MTJ at the first position P1.

The sample S may be rotated to move a measurement position, to which the incident light Li is incident, from the first position P1 to the second position P2 (in S120). The first polarization axis 42 of the polarizer 40 and the second polarization axis 72 of the analyzer 70 may be rotated depending on the rotation angle π of the sample S (in S130). Thereafter, a magnetic property of the magnetic tunnel junction patterns MTJ of the sample S may be measured at the second position P2 (in S140). As described with reference to FIGS. 3, 10, and 11, to measure a magnetic property of the magnetic tunnel junction patterns MTJ at the second position P2, the incident light Li may be polarized by the polarizer 40 having the rotated first polarization axis 42r and may be incident to the second position P2, and the reflection light Lr reflected from the second position P2 may be polarized by the analyzer 70 having the rotated second polarization axis 72r and may be received by the detector 80. Thus, it may be possible to effectively measure a magnetic property of the magnetic tunnel junction patterns MTJ at the second position P2.

As an example, the controller 90 of FIG. 1 may produce a magnetic hysteresis curve of the magnetic tunnel junction patterns MTJ, based on data obtained by the detector 80. The magnetic hysteresis curve may be used to obtain information on magnetic characteristics (e.g., exchange magnetic field (Hex), coercive force (Hc), in-chip variation in Hc of magnetic tunnel junction patterns, and so forth) of the magnetic tunnel junction patterns MTJ.

Referring to FIGS. 12 and 15, a determination may be made regarding whether the measured magnetic property of the magnetic tunnel junction patterns MTJ is within an allowable range (in S250). If the measured magnetic property is beyond the allowable range, an alert may be issued (in S260). If the measured magnetic property is within the allowable range, a subsequent process may be performed (in S270). For example, a third interlayered insulating layer 180 may be formed on the second interlayered insulating layer 130 to cover the magnetic tunnel junction patterns MTJ, the bottom electrodes BE, and the top electrodes TE. The protection layer 170 may be provided between the magnetic tunnel junction patterns MTJ to be interposed between the magnetic tunnel junction patterns, bottom electrodes, and top electrodes MTJ, BE, and TE and the third interlayered insulating layer 180 and between the second and third interlayered insulating layers 130 and 180. The third interlayered insulating layer 180 may be formed to fill a space between the magnetic tunnel junction patterns MTJ. The third interlayered insulating layer 180 may be formed of or include at least one of oxide, nitride, or oxynitride. Bit lines 190 may be formed on the third interlayered insulating layer 180. Each of the magnetic tunnel junction patterns MTJ may be connected to a corresponding one of the bit lines 190. The bit lines 190 may be formed of or include at least one of metallic materials (e.g., titanium, tantalum, copper, aluminum, or tungsten) or conductive metal nitrides (e.g., titanium nitride or tantalum nitride).

Figure 16:
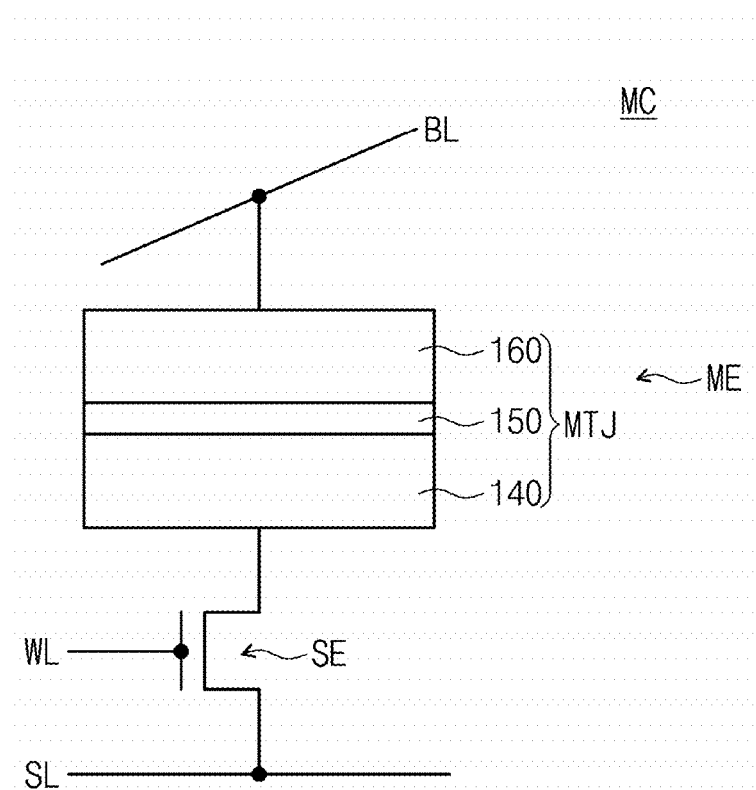
FIG. 16 is a circuit diagram illustrating a unit memory cell of a magnetic memory device according to some example embodiments of the inventive concepts.

FIG. 16 is a circuit diagram illustrating a unit memory cell of a magnetic memory device according to some example embodiments of the inventive concepts.

Referring to FIG. 16, a unit memory cell MC may include a memory element ME and a selection element SE, which are connected in series. The memory element ME may be provided between and connected to the bit line BL and the selection element SE. The selection element SE may be provided between and connected to the memory element ME and a source line SL and may be controlled by a word line WL. The memory element ME may include the magnetic tunnel junction pattern MTJ, which is composed of the first and second magnetic patterns 140 and 160 and the tunnel barrier pattern 150 therebetween. One of the first and second magnetic patterns 140 and 160 may be a reference layer whose magnetization direction is fixed independent of an external magnetic field generated in a typical usage environment, and the other of the first and second magnetic patterns 140 and 160 may be a free layer whose magnetization direction can be switched by an external magnetic field applied thereto or a spin torque of electrons in a program current. The magnetic tunnel junction pattern MTJ may have an electric resistance that is much greater when the reference and free layers have antiparallel magnetization directions than when the reference and free layers have parallel magnetization directions. This means that the electrical resistance of the magnetic tunnel junction pattern MTJ can be controlled by changing the magnetization direction of the free layer. A difference in electric resistance of the magnetic tunnel junction pattern MTJ, which is caused by a difference in magnetization direction between the reference and free layers, may be used as a data storing mechanism of the unit memory cell MC.

According to some example embodiments of the inventive concepts, each of the polarizer 40 and the analyzer 70 in the magnetic property measuring system 1000 may be configured to allow each of the first and second polarization axes 42 and 72 to be rotated depending on the rotation angle π of the sample S. In this case, even when the reflection light Lr is obtained at various positions of the sample S, it may be possible to easily remove a polarized noise light in the reflection light Lr and thereby to obtain a signal light whose intensity is high enough to obtain effective information on a magnetic property of the magnetic tunnel junction patterns MTJ. That is, it may be possible to improve a signal-to-noise ratio (SNR) property of the magnetic property measuring system 1000 and to effectively measure a magnetic property of the magnetic tunnel junction patterns MTJ at various positions.

Furthermore, in the case where the magnetic property measuring system 1000 is used, a magnetic property of the magnetic tunnel junction patterns MTJ may be easily monitored during a process of fabricating a magnetic memory device. Thus, a method of fabricating a magnetic memory device, which is suitable for a mass-production and has stable quality characteristics, may be provided.

According to some example embodiments of the inventive concepts, it may be possible to realize a magnetic measurement system having an improved signal-to-noise ratio (SNR) property and to easily measure a magnetic property of a magnetic tunnel junction pattern at various positions of a sample. In addition, it may be possible to provide a method of fabricating a magnetic memory device, which is suitable for a mass-production and has stable quality characteristics.

While some example embodiments of the inventive concepts have been particularly shown and described, it will be understood by one of ordinary skill in the art that variations in form and detail may be made therein without departing from the spirit and scope of the attached claims.

What is claimed is:

1. A magnetic property measuring system, comprising:
a stage configured to load a sample and to rotate the sample about a rotation axis such that the stage rotates the sample by a rotation angle, the rotation axis extending normal to a top surface of the sample;
a polarizer having a first polarization axis;
an analyzer having a second polarization axis; and
a controller configured to control the polarizer and the analyzer to cause each polarization axis of the first and second polarization axes to be independently rotated based on the rotation angle of the sample,
wherein the controllre is further configured to rotate the stage to rotate the sample by the rotation angle and to cause the first polarization axis to be rotated by a first angle and the second polarization axis to be rotated by a second angle, such that each angle of the first angle and the second angle is in proportion to the rotation angle of the sample.

2. The system of claim 1, further comprising:
a light source configured to emit an incident light beam toward the sample, such that the incident light beam is incident to the sample through the polarizer; and
a detector configured to detect polarization of a reflection light beam reflected from the sample based on the incident light beam being emitted toward the sample,
wherein the detector is configured to receive the reflection light beam through the analyzer.

3. The system of claim 2, wherein
the light source is configured to be rotated about a light source rotation axis substantially parallel to a propagation direction of the incident light beam,
the propagation direction of the incident light beam is a direction from the light source toward the polarizer, and
the light source is configured to be rotated based on the rotation angle of the sample.

4. The system of claim 3, wherein the light source is configured to emit a laser beam.

5. The system of claim 1, wherein the rotated second polarization axis is aligned to be substantially perpendicular to the rotated first polarization axis.

6. The system of claim 2, further comprising:
a plurality of coil structures configured to apply a magnetic field to the sample, the magnetic field substantially perpendicular to the top surface of the sample,
wherein each coil structure of the plurality of coil structures includes a pole piece and a coil enclosing an outer circumference surface of the pole piece.

7. The system of claim 2, wherein the controller is configured to produce a magnetic hysteresis curve, based on data obtained by the detector.

8. The system of claim 2, wherein the light source is configured to be fixed or rotated while the polarizer and the analyzer are rotated to enable the first and second polarization axes to be independently rotated based on the rotation angle of the sample.

9. The system of claim 1, wherein the stage is further configured to move the sample in a horizontal plane in addition to being configured to rotate the sample by the rotation angle.

* * * * *